United States Patent [19]

Spruck

[11] Patent Number: 4,574,178

[45] Date of Patent: Mar. 4, 1986

[54] ELECTRON GUN

[75] Inventor: Helmut Spruck, Gilching, Fed. Rep. of Germany

[73] Assignee: Leybold-Heraeus GmbH, Cologne, Fed. Rep. of Germany

[21] Appl. No.: 650,403

[22] Filed: Sep. 13, 1984

[30] Foreign Application Priority Data

Sep. 17, 1983 [DE] Fed. Rep. of Germany ....... 3333686

[51] Int. Cl.⁴ .......................................... H01J 37/065
[52] U.S. Cl. ........................ 219/121 ET; 219/121 EB; 219/121 EZ; 219/121 EA
[58] Field of Search ................... 219/121 EB, 121 EC, 219/121 ED, 121 EA, 121 EM, 121 ET, 121 EZ

[56] References Cited

U.S. PATENT DOCUMENTS

| | | | |
|---|---|---|---|
| 3,033,974 | 5/1962 | Schleich et al. | 219/121 ED |
| 3,192,318 | 6/1965 | Schleich et al. | 219/121 EA |
| 3,197,669 | 7/1965 | Solomon | 219/121 ET |
| 4,084,076 | 4/1978 | Istomin et al. | 219/121 ET |

*Primary Examiner*—Clifford C. Shaw
*Assistant Examiner*—Alfred S. Keve
*Attorney, Agent, or Firm*—Felfe & Lynch

[57] ABSTRACT

An electron gun with a beam generator 4, a high-voltage connection 25 and a high-voltage insulator 23 is equipped with at least one insulating transformer 26, 27 and circuit elements 43 for producing auxiliary voltages at high-voltage potential. The beam generator 4 and the high-voltage insulator 23 are surrounded by a grounded metallic jacket 32. The insulating transformer is arranged above the high-voltage insulator 23. For the purpose of solving the problem of permitting use of a single-pole high-voltage cable, the one or more insulating transformers 26, 27 are embedded in an insulating member 24 which is mounted directly on the high-voltage insulator 23. The portion of the insulating member 24 that projects beyond the grounded jacket 32 is surrounded by a metallic hood which, together with the jacket 32, forms a common Faraday cage. The circuit elements 43 for the auxiliary voltages are likewise arranged in the Faraday cage.

12 Claims, 7 Drawing Figures

ELECTRON GUN

The invention relates to an electron gun, particularly for heating materials, for example, for welding purposes, and preferably comprising: a beam generator with a cathode and beam-forming electrode; a high-voltage connection and a high-voltage insulator to which the beam generator is attached; and at least one insulating transformer and circuit elements for producing auxiliary voltages at high-voltage potential, the beam generator and the high-voltage insulator being surrounded by a grounded metallic jacket, and the insulating transformer being disposed above the high-voltage insulator.

In the case of electron guns of this kind, the high-voltage insulator with its supply lines for the beam generator and the insulating transformer which is disposed thereabove and performs the function of an auxiliary voltage converter, are often referred to as a "beam head". In the beam heads of known electron guns, the parts at negative high-voltage potential are connected to a tank which is filled with insulating oil and on the upper surface of which the insulating transformer is also fitted. A three-conductor high-voltage cable extends into the tank, and the acceleration voltage as well as the auxiliary voltages for the beam-forming electrode (Wehnelt electrode) and the heating of the cathode are produced in the zone of the beam head, and appropriate wiring is provided within the beam head (DE-PS No. 1 087 295 and DE-PS No. 1 131 760).

Also known are constructions which are mainly operated with an acceleration voltage of below 100 kV and wherein the high-voltage potentials are fed to the beam head through a number of single-pole high-voltage cables. The number of potentials to be fed is dependent upon the type of electron beam generator that is used. Directly heated triodes require three potentials, and indirectly heated triodes require four potentials; diode systems and X-ray tubes without adjustable Wehnelt voltage require two potentials at the cathode side.

For the purpose of enabling them to be fitted in a safe manner, the high-voltage cables are usually connected by means of plugs, which can be withdrawn for inspection purposes. Cable and plug connections are designed for currents of up to 50 amperes, and the individual potentials up to operating voltages of 5 kV are insulated from each other. Cables of this kind are very heavy and rigid because of the necessary cross-sections of copper material, the insulation thicknesses and the protective armouring, and the plug connections are of considerable size and are costly. Furthermore, multi-pole cables of this kind always constitute special products for the manufacturers of electron guns and are expensive for this reason too. Further negative properties of multi-pole cables are the high internal capacity of the line, carrying the Wehnelt voltage, relative to the cathode potential, as well as the resistance of those lines which carry the cathode heating current The losses in the heating circuit due to the line resistance in the high-voltage cable amount to as much as 90% of the total energy transformed at high-voltage potential. Consequently, the insulating transformer must be of correspondingly high rating. The high internal capacity has an adverse effect upon rapid reversal of the Wehnelt voltage, so that the source of the Wehnelt voltage must also be correspondingly rated, particularly when the beam current is to be controlled by pulses having steep ascending and descending sides.

The high-voltage insulator, which likewise forms part of the beam head and to which the beam generator is secured, is also an important component. In the case of electron guns that can be operated at acceleration voltages of up to 150 kV, use has been made of insulators in the form of plugs or tubes. In electron guns having acceleration voltages of below 100 kV, a disc-shaped high-voltage insulator has also been used. However, these insulators suffer from the common disadvantage that they have to be fitted as individual components in expensive metal casings which, in the majority of cases, are also under vacuum and are always accompanied by problems relating to supply lines and/or insulation.

An object of the present invention is, therefore, to provide an electron gun of the initially described type wherein what is called the "beam head" is of maximally compact construction and is connected to the generator of the acceleration voltage only by way of a single-pole high-voltage cable, so that the line losses can be kept as low as possible.

According to the invention, and in the case of the initially described electron gun, this object is achieved in that (a) the insulating transformer or transformers is or are embedded in an insulating member;

(b) the insulating member is mounted directly on the high-voltage insulator, (c) the portion of the insulating member that overlaps the grounded jacket is surrounded by a metallic hood which encloses the insulating transformer and together with the jacket forms a Faraday cage, and in that (d) the circuit elements for the auxiliary voltages are likewise disposed in the Faraday cage.

Simplification of the construction of the beam head involving complete transmission of auxiliary voltage renders the multi-pole high-voltage cable and the multi-pole plug connections unnecessary, so that the capacitive and ohmic line losses are reduced to almost zero. Because of the absence of these losses, the power to be transmitted is so small that the volume of the insulating transformers is no longer determined by the power to be transmitted, but only by the required insulation gaps. By using higher transmission frequencies and suitable transformer cores for them and by embedding them in the same insulating member, the total gas volume of the complete converter equipment can be limited to a size which permits the equipment to be mounted directly on the high-voltage insulator, so that two insulation gaps with regard to ground are dispensed with, and the entire volume is again favorably influenced. In this system, the insulation transformers are fed at ground potential in the usual manner. The control voltages are supplied through multiple plugs at the low-voltage potential of the beam head.

Important advantages of the equipment in accordance with the invention are as follows:

the multiple, specially produced high-voltage cable is no longer required, so that a commercially available single-pole cable can be used, defects between the potentials of the cable due to flash-over in the gun and leading to overloading of the insulation are avoided, no defects due to heavy loading by the heating current occur at the plug connection, because of the very much smaller inductive and capacitive coupling between the individual potentials, a considerable reduction is achieved in the load and therefore in the breakdowns in the supply of auxiliary voltage caused by travelling waves which are released by flash-overs, if the auxiliary voltage supply fails, no high-voltage oil tanks have to be opened; all that is necessary is to remove the beam head. The electron gun is therefore easier to supervise, the size of the equipment for providing high voltage, in which the provision of auxiliary voltage is integrated, becomes smaller; in some cases, the auxiliary voltage tank can be dispensed with completely.

Particular advantage accrues if, in accordance with a further feature of the invention, the insulation member, in which the one or more insulating transformers are embedded, is made of a cast resin composition. This results in the further advantage that:

the high-voltage insulator as well as the insulating transformer or transformers can be cast directly into their metal jacket or hood. This results in the provision of a beam head which comprises only two constructional parts, namely of the high-voltage insulator with the high-voltage connection and the assembly flange for the beam generator and of the insulating transformer or transformers which is or are secured thereon and which also contain the auxiliary voltage transmitters.

It is also particularly advantageous if the circuit elements for the auxiliary voltages are accomodated within the Faraday cage in a completely closed capsule made of a ferromagnetic material.

By making this capsule of magnetic material, the magnetic effect of the insulating transformer or transformers on the beam generator is reduced to such an extent that the effect of the still present magnetic field on the electron beam is not critical.

In accordance with the invention, an electron gun comprises a beam generator with a cathode and a beam-forming electrode. The gun includes a high-voltage connection and a high-voltage insulator to which the beam generator is attached. The electron gun also includes at least one insulating transforming and circuit means for producing auxiliary voltages at high-voltage potential and a grounded conductive jacket surrounding the beam generator and the high-voltage insulator. The insulating transformer is disposed above the high-voltage insulator. The electron gun also includes insulating means mounted directly on the high-voltage insulator. At least one insulating transformer is embedded in the insulating means. A portion of the insulating means overlaps the grounded jacket. The electron gun also includes a conductive hood which surrounds the aforesaid portion of the insulating means and which encloses the aforesaid at least one insulating transformer and together with the jacket forms a Faraday cage, the circuit means for the auxiliary voltages also being disposed in the Faraday cage.

For a better understanding of the present invention, together with other and further objects thereof, reference is made to the following description, taken in connection with the accompanying drawings, and its scope will be pointed out in the appended claims.

Figure 1:
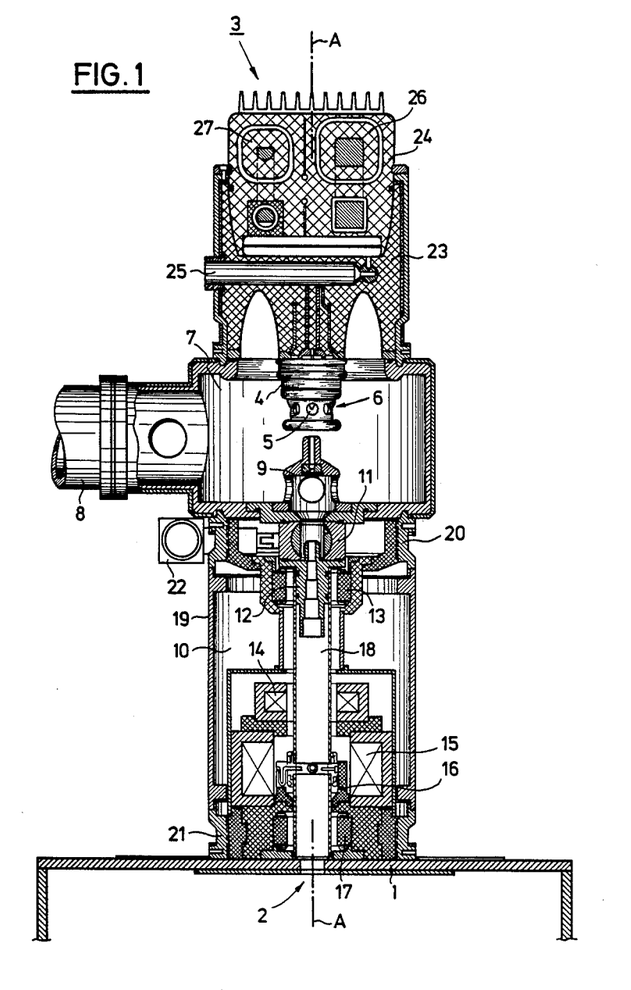
FIG. 1 is a vertical sectional view through a complete electron gun.

Only the upper portion of a work chamber 1 is shown in FIG. 1. Formed in the upper limiting wall of this chamber is a beam-inlet opening 2, which is aligned with the axis A—A of an electron gun 3.

As regards generation and guiding of the beam, the electron gun preferably comprises three important portions or constructional groups, namely a beam generator 4 with a cathode 5 and a beam-forming electrode 6 (Wehnelt cylinder), an acceleration chamber 7, which is connected by way of a suction port 8 to a vacuum pump, not illustrated, and in which is provided an acceleration anode 9, and of a beam-guide chamber 10 in which—as seen in the direction of the beam—are disposed a cut-off valve 11, a throttle element 12, an adjusting device 13, a wobble lens 14, a focusing lens 15, a sensor arrangement 16, and a deflecting unit 17. A beam-guide tube 18 extends through the components 13 to 17.

The beam-guide chamber 10 and all the components contained therein preferably are surrounded by a jacket tube 19 which is firmly connected at its upper and lower end by a flange 20 and 21 respectively. Preferably secured to the side of the upper flange 20 is a rotary drive 22 for the cut-off valve 11. The beam generator 4 is secured to a high-voltage insulator 23 in which is provided a high-voltage connection 25 for the current supply. Mounted on the high-voltage insulator 23 preferably is an insulating member 24 in which two insulating transformers 26 and 27 are embedded. Further details are described by reference to FIG. 2, in which parts similar to those in FIG. 1 carry the same reference numerals as in the latter Figure.

Figure 2:
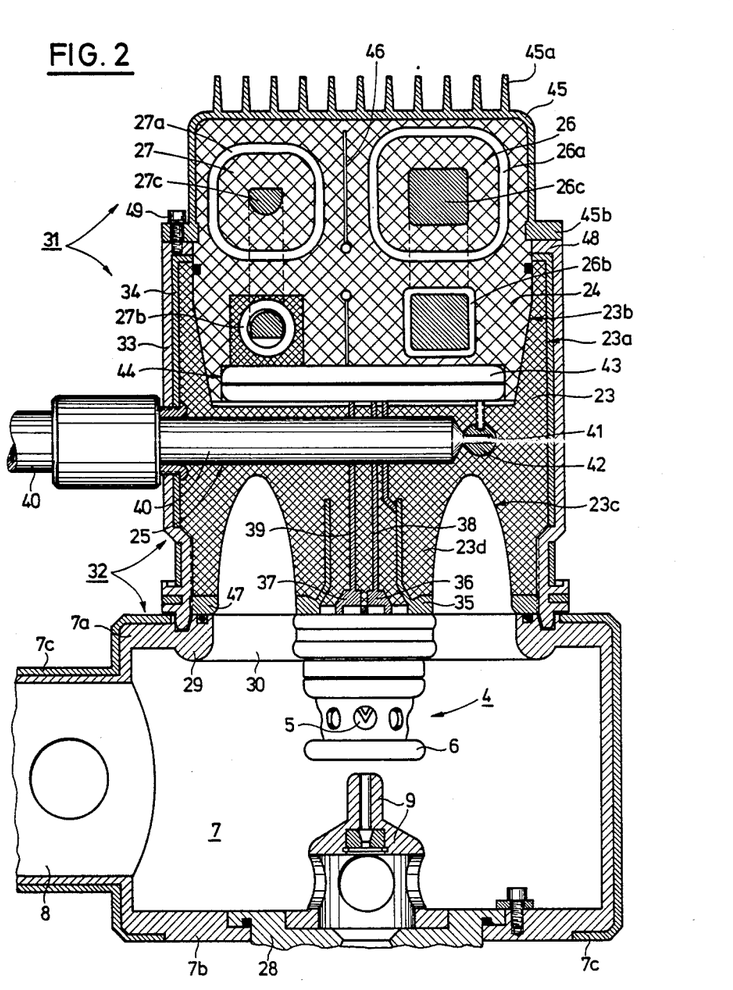
FIG. 2 is a vertical sectional view through the upper portion of the gun—known as the "beam head"

The acceleration chamber 7 preferably is surrounded by a casing 7a which has a bottom wall 7b presented to the beam-guide chamber 10 (FIG. 1). The bottom wall preferably carries, in a circular cut-away portion, a centering flange 28 in which the accelerating anode 9 is secured, also in a concentric arrangement. The top face of the accelerating chamber 7 preferably comprises a fixing flange 29 which surrounds a circular opening 30 and on which is mounted the "beam head" 31 described in detail hereinafter.

The beam generator 4 and the high-voltage insulator 23 which supports it preferably are surrounded by a metallic, grounded jacket 32, with which preferably are associated an outer housing 7c for the accelerating chamber and a substantially cylindrical housing 33 into which is cast the high-voltage insulator 23, made of resin, a lead covering 34 being interposed between the housing 33 and the insulator 23. This high-voltage insulator likewise preferably has a substantially cylindrical outer surface 23a and preferably has, at its upper surface, a recess 23b, the lower portion of which is of frusto-conical shape. This recess serves to accomodate the insulating member 24 which is therefore of complementary shape at the contact area. At its lower face, the high-voltage insulator 23 preferably has a circular depression 23c, which is concentric with the beam generator 4, is of generally parabolic cross-section and serves to increase the space between surfaces, i.e. the insulation gap. At the center of the depression 23c, the high-voltage insulator 23 preferably has an extension 23d into which is cast an assembly flange 35, which serves to secure the beam generator 4. At its interior, the assembly flange 35 preferably carries connection contacts 36 and 37 to which are supplied, through lines 38 and 39 respectively, the Wehnelt potential and the heating current. The connecting lines preferably are also embedded in cast resin in a vacuum-tight manner.

Preferably disposed approximately diametrically above the recess 23c is the high-voltage connection 25, into which is introduced a high-voltage cable 40 which at its one end carries a plug 41 which co-operates with the complementary socket 42. From here the high voltage passes to circuit elements 43 of known form and illustrated only diagrammatically, these elements preferably being fully enclosed in a capsule 44 of ferromagnetic material. This capsule preferably is flat and disc-shaped and almost completely fills the cross-section of the recess in the bottom zone thereof. The capsule 44 thus acts as a screen for the magnetic fields emanating from the two insulating transformers 26 and 27, so that no interference is possible with the electron beam passing downwardly from the cathode 5. The capsule preferably is mechanically secured to the insulating member 24. It contains the circuit elements for rectification and screening of the Wehnelt voltage and the cathode heating current.

Each of the two insulating transformers 26 and 27 embedded in the insulating member 24 preferably has a primary winding 26a and 27a, respectively, and a secondary winding 26b and 27b, respectively, which are interconnected by an iron core 26c and 27c, respectively. It will be seen that the insulating member 24 projects upwardly beyond the casing 33. In order to close the opening in the Faraday cage that is present at this point, that portion of the insulating member 24 that projects beyond the grounded jacket 32 preferably is surrounded by a metallic hood 45 which encloses the insulating transformers 26 and 27 and which preferably has cooling ribs 45a on its upper face. In this way, the circuit elements 43 are likewise accomodated within the Faraday cage. Magnetic screens 46 preferably are arranged between the two insulating transformers 26 and 27 so as to screen them from each other.

The casing 33 preferably is provided at its lower end with a fixing flange 47 for vacuum-tight connection to the accelerating chamber 7, and at its upper end it preferably has a fixing flange 48 for connection to a co-operating flange 45b associated with the hood 45. Fixing preferably is achieved by means of a row of screws 49 spaced around the circumference. The Faraday cage is closed as a result of the metallic construction of the jacket 32 and the hood 45. The parts that are disposed above the fixing flange 29 and are connected to the casing 33, i.e. to the high-voltage insulator 23, form what is called the "beam head" 31. In the present case, the insulating transformer 26 acts as a converter for the cathode current, and the insulating transformer 27 as a converter for the Wehnelt voltage. The cores 26c and 27c with the secondary windings 26b and 27b are also at high-voltage potential. Only the two primary windings 26a and 27a are at ground potential.

The beam head can be easily removed in its entirely by releasing the connection between the two fixing flanges 29 and 47, so that the beam generator 4 is also readily accessible for inspection purposes. However, the insulating member 24 together with all of the components contained therein can also be separately removed by loosening the screw 49. Establishment of electro-mechanical contact between the secondary windings 26b and 27b and the connecting lines 38 and 39 respectively is achieved, after the insulating member 24 has been fitted, by way of narrow ducts, not shown, in the insulating member 24, through which ducts the corresponding contact screws, likewise not shown, can be turned. All of the free spaces within the beam head are filled with oil so as to prevent sudden increases in potential within the head.

Figure 3:
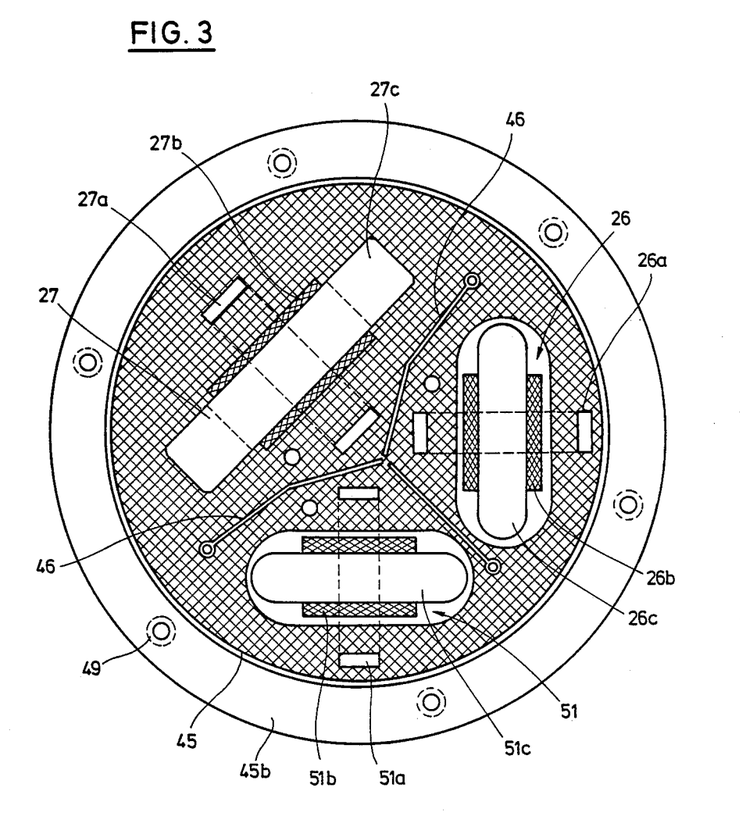
FIG. 3 is a horizontal sectional view through the insulating member with three insulating transformers embedded therein.

FIG. 3 illustrates a further possible form of construction of the beam head shown in FIG. 2. In the FIG. 3 embodiment, a third insulating transformer 51 is provided in addition to the two insulating transformers 26 and 27, which third transformer likewise comprises a primary winding 51a, a secondary winding 51b and a core 51c. With the help of the insulating transformer 51, a further controllable or fixed voltage becomes available at high-voltage potential and can be used for controlling a second beam-forming electrode if a tetrode system, for example, is used as the beam generator 4. The third auxiliary voltage can also be used as an anode voltage so that, in a triode system, a cathode can be indirectly heated up to emission temperature by means of electrons. A roughly star-shaped arrangement of three screens 46 of a ferromagnetic material is in this case provided between the three insulating transformers so as to suppress the reciprocal influence of the induction effect.

Figure 4:
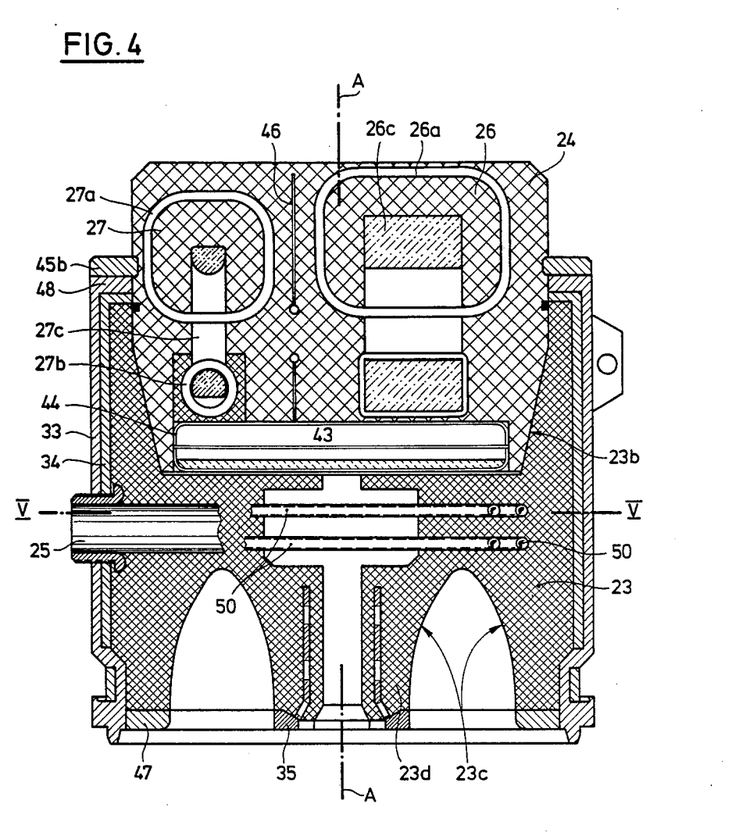
FIG. 4 is a vertical sectional view through the upper portion of the beam head with coolant ducts embedded in the high-voltage insulator.

FIG. 4 also shows a beam head similar to that of FIG. 2, but the hood 45 has not been included in the drawing.

The high-voltage insulator permits only the take-up and dissipation of a certain power loss occurring at the cathode. If this becomes too great, it can lead to defects at the high-voltage insulator and the insulating transformers because of loosening of the mechanical and electrical fixing means. The permissible thermal load can be exceeded by, for example, the use of cathodes having an increased heating power, for instance, when use is made of solid tungsten cathodes for beam currents in excess of 100 mA. A solution to this problem is illustrated in FIG. 4:

In two planes, which extend parallel to the bottom of the recess 23b and therefore radially of the axis A—A, there are provided coolant ducts 50 which are arranged between the bottom and the circumferential depression 23c, the disposition of these ducts being explained in greater detail by reference to FIG. 5. The coolant ducts are made of plastics material and are cast at the indicated position into the cast resin composition forming the high-voltage insulator 23. Coolant in the form of, for example, transformer oil, is pumped through from the exterior so as to avoid excessive sudden increases in potential. By means of this structure it is possible to extract considerable quantities of heat from the insulator so that neither the function of the high-voltage insulator nor that of the insulating transformers is adversely affected.

Figure 5:
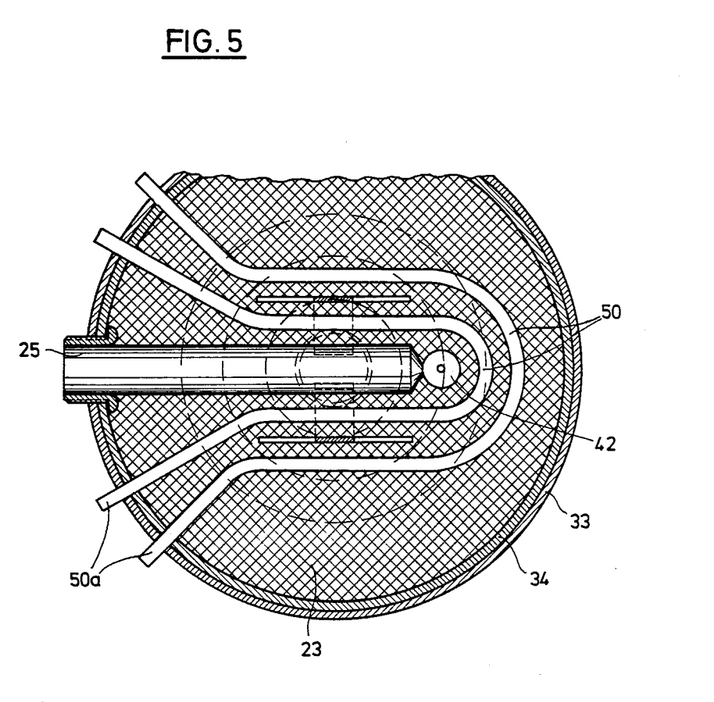
FIG. 5 is a horizontal sectional view through the FIG. 4 subject-matter along the line V—V.

It will be seen from FIG. 5 that the coolant ducts 50 are bent to the shape of a letter U, and the straight limb portions are roughly parallel to each other while the curved bottom of each U is laid concentrically around the center point of the socket 42. The outwardly leading ends 50a are fanned out radially to a slight extent to facilitate establishment of the connections. The high-voltage connection 25 lies in the plane of symmetry between the coolant ducts (see also FIG. 4). The paraboloid form of the circumferential depression 23c combines the advantages of compactness and the smallest possible surface as regards dissipation of gas. In particular, however, the surface is so positioned that it is protected from the electrons and ions leaked in the accelerating chamber 7.

Figure 6:
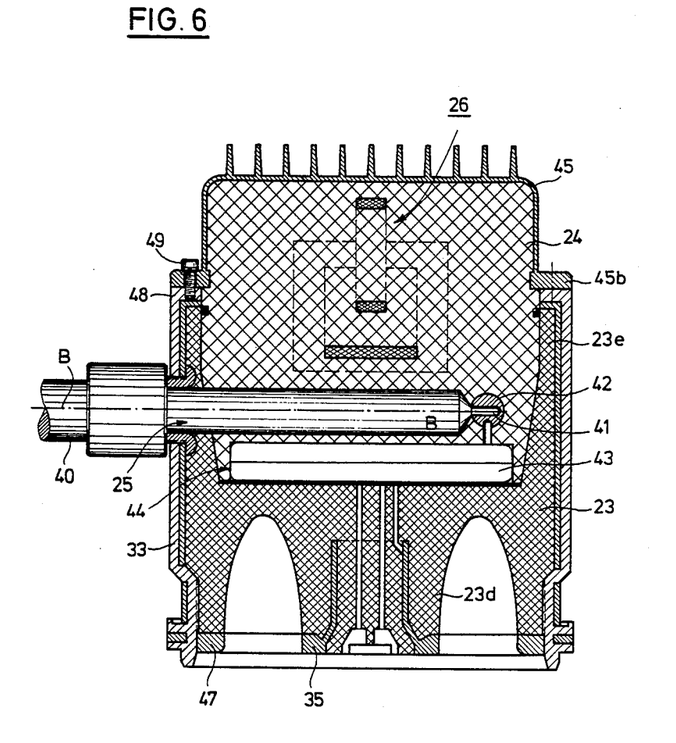
FIG. 6 is a vertical sectional view through the upper portion of the beam head and shows a high-voltage cable introduced horizontally into the insulating member.

FIG. 6 shows a modified form of the embodiment of FIGS. 1 and 2. In the FIG. 6 embodiment, the high-voltage cable 40 is not introduced into the high-voltage insulator alone in the zone of the high-voltage connection 25, but into the cast-resin insulating member 24 and, in fact, above the circuit elements 43 in this case. For this purpose, the recess 23b is made somewhat deeper, and in the upwardly extending collar 23e of the high-voltage insulator 23 as well as in the casing 33 there is formed a continuous radial bore into which the end of the high-voltage cable 40 can be introduced. This radial bore continues within the insulating member 24 in the horizontal direction as far as the socket 42, the axis of the high-voltage connection 25 being indicated by the letters B—B and coinciding with the insertion direction. In this way, the effect on the geometry of the beam of any peaks or sudden increases within the electrical field is further reduced. The screening effect is further increased by arranging the ferromagnetic capsule 44 with the circuit elements 43 below the high-voltage cable. It will be understood that the insulating member 24 with the insulating transformer 26 etc., passed into it, can be removed only after the high-voltage cable 40 has been withdrawn.

Figure 7:
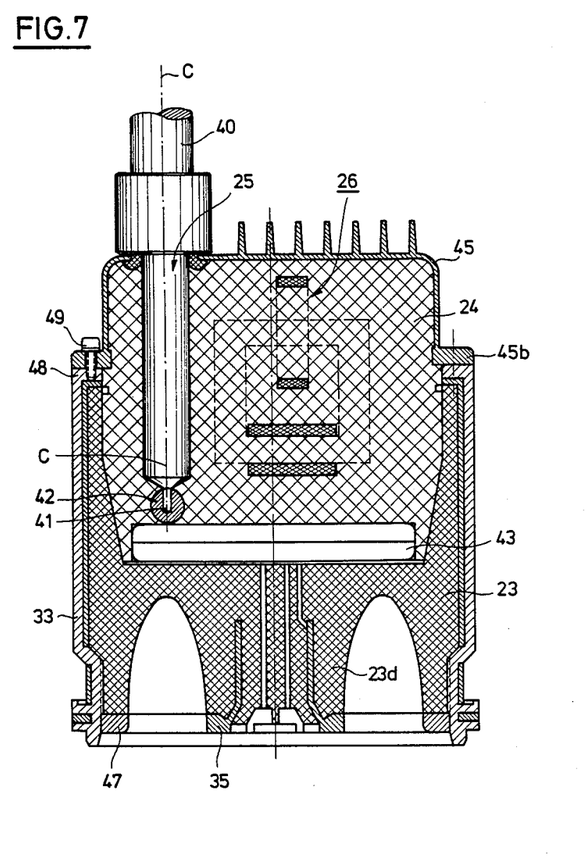
FIG. 7 is a vertical section similar to FIG. 6, but with a high-voltage cable introduced vertically into the insulating member.

The form of construction shown in FIG. 7 differs from that of FIG. 6 only in that the high-voltage cable 40 is introduced into the insulating member 24 from above, i.e., the axis C—C of the cable is perpendicular, and insertion also takes place in the vertical direction. In this case it is not necessary to provide a bore in the high-voltage insulator 23 and in the casing 33 surrounding it; this bore is formed in the upper limiting face of the hood 45.

Because of the compact manner in which the various parts are arranged within the beam head, the total volume of oil is so small that the expansion of the oil caused by the heating up of the electron gun during use can be taken up in a buffer chamber which is located at ground potential in the field-free space and communicates with the outside air by way of a capillary connection.

Because of the absence of the ground capacity of the Wehnelt voltage at the high-voltage side, the power loss in the circuit at the secondary side is negligibly small. For this reason, it is a simple matter to produce and rectify, by way of the insulating transformers, A.C. voltages having amplitudes up to 2.5 kV and frequencies of up to 15 kHz at the high-voltage side. The high frequencies again result in a likewise small consumption by filter means for the necessary smoothing of the voltage. This also enables the internal capacity to be kept relatively low.

If the possibilities offered by the individual insulating transformers (converters) are fully exploited, pulse excitation, variations in slope, programmed control of any required kind, etc., can be achieved in a relatively simple manner. It is also possible, for the purpose of producing the Wehnelt voltage, to provide two insulated transformers in the beam head and to connect them in parallel. The two insulating transformers preferably are controlled by the same electronic unit by means of currents, the phases of which are shifted through 90 degrees. When a bridge rectifier is used, an overlapping four-pulse A.C. voltage then occurs at the secondary side of the insulating transformers, and even if no filter means at all is used, a D.C. voltage having a residual ripple of 8% at 60 kHz occurs.

The pulses or pulse groups and the beam current flowing during this time preferably are controlled in a simple manner: the number of A.C. voltage pulses per unit of time determines the length of the individual pulses, and the voltage level determines the beam current that flows. Given a suitable rating of the filter means, beam-current pulses with an approximately 10 kHz steepness of side at a keying ratio of 1:1 can be produced with a residual ripple of 2% at 60 kHz. The keying ratio depends entirely upon the type of control electronics which can be at ground potential and therefore of simple design.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed is:

1. An electron gun comprising:
   a beam generator with a cathode and beam-forming electrode;
   a high-voltage connection and a high-voltage insulator to which said beam generator is attached;
   at least one insulating transformer and circuit means for producing auxiliary voltages at high-voltage potential;
   a grounded conductive jacket surrounding said beam generator and said high-voltage insulator, said insulating transformer being disposed above said high-voltage insulator;
   insulating means mounted directly on said high-voltage insulator, said at least one insulating transformer being embedded in said insulating means, a portion of said insulating means overlapping said grounded jacket; and
   a conductive hood which surrounds said portion of said insulating means and which encloses said at least one insulating transformer and together with said jacket forms a Faraday cage, and said circuit means for the auxiliary voltages also being disposed in said Faraday cage.

2. An electron gun according to claim 1 in which said insulating means is made of a cast resin composition.

3. An electron gun according to claim 1, in which circuit means for the auxiliary voltages are accomodated in a fully closed capsule made of ferromagnetic material.

4. An electron gun according to claim 3, in which said capsule together with said circuit means are disposed between a portion of said high-voltage insulator and a portion of said insulating member.

5. An electron gun according to claim 1, in which said high-voltage connection comprises a plug connection and is accomodated within said high-voltage insulator.

6. An electron gun according to claim 1, in which said high-voltage insulator has a substantially cylindrical outer surface, is provided at said outer surface with a casing having an upper and lower connecting flange, has at its top a recess for receiving said insulating member, said hood being connectible with said upper connecting flange, said beam generator having a generally cylindrical shape, and said high-voltage insulator having at its lower face and concentric with said beam generator a circular recess for increasing the insulation gap.

7. An electron gun according to claim 1, in which said insulating member contains at least two insulating transformers and magnetic screens therebetween.

8. An electron gun according to claim 7, in which by means of the said circuit means, said insulating transformers can be operated at a phase-shift of 90 degrees.

9. An electron gun according to claim 1, in which said high-voltage insulator includes coolant ducts.

10. An electron gun according to claim 1, in which said high-voltage connection comprises a plug connection and is accomodated within said insulating member.

11. An electron gun according to claim 10, in which said high-voltage connection has a horizontal axis.

12. An electron gun according to claim 10, in which said high-voltage connection has a vertical axis.

* * * * *